United States Patent
You et al.

(10) Patent No.: US 12,113,536 B2
(45) Date of Patent: Oct. 8, 2024

(54) HIGH SPEED SAMPLING CIRCUIT

(71) Applicant: SHENZHEN PANGO MICROSYSTEMS CO., LTD, Shenzhen (CN)

(72) Inventors: Guangyao You, Shenzhen (CN); Yuanjun Liang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 0 days.

(21) Appl. No.: 18/253,050

(22) PCT Filed: Mar. 24, 2021

(86) PCT No.: PCT/CN2021/082548
§ 371 (c)(1),
(2) Date: May 16, 2023

(87) PCT Pub. No.: WO2022/116414
PCT Pub. Date: Jun. 9, 2022

(65) Prior Publication Data
US 2023/0421142 A1 Dec. 28, 2023

(30) Foreign Application Priority Data
Dec. 1, 2020 (CN) .......................... 202011390177.9

(51) Int. Cl.
*H03K 3/02* (2006.01)
*G11C 7/06* (2006.01)
(Continued)

(52) U.S. Cl.
CPC ......... *H03K 3/35613* (2013.01); *G11C 7/065* (2013.01); *G11C 27/02* (2013.01); *H03M 1/1245* (2013.01)

(58) Field of Classification Search
CPC ........ H03K 3/02; H03K 3/023; H03K 3/0233; H03K 3/353; H03K 3/356;
(Continued)

(56) References Cited

U.S. PATENT DOCUMENTS

2019/0334514 A1* 10/2019 Xu ....................... H03K 19/003

FOREIGN PATENT DOCUMENTS

CN 107493093 A 12/2017

* cited by examiner

*Primary Examiner* — Long Nguyen
(74) *Attorney, Agent, or Firm* — Jeenam Park

(57) ABSTRACT

A high-speed sampling circuit is disclosed which comprises a sampling module for amplifying a differential input signal; a latch module for latching the differential output signal of the sampling module; a first control module for controlling the sampling module under a first clock signal; a second control module for controlling the latch module under a second clock signal; a third control module for controlling control the output of the differential output signal under the second clock signal. The high-speed sampling circuit of the disclosure, after sampling the differential input signal, the sampling module outputs it to the latch module and controls the latch module to output the differential output signal, compared to the existing two-stage sampling module, it saves the transmission delay of the two-stage sampling module and can improve the performance of the high-speed sampling band of the signal.

8 Claims, 4 Drawing Sheets

(51) Int. Cl.
   *G11C 27/02*   (2006.01)
   *H03K 3/356*   (2006.01)
   *H03M 1/12*    (2006.01)
(58) Field of Classification Search
   CPC ....... H03K 3/356017; H03K 3/356026; H03K
         3/356034; H03K 3/356086; H03K
         3/356095; H03K 3/356104; H03K
         3/356113; H03K 3/356121; H03K
         3/35613; H03K 3/356139; H03K
       3/356182; H03K 3/356191; H03K 5/24;
         H03K 5/2472; H03K 5/2481; H03K
         5/249; G11C 7/06; G11C 7/065; G11C
            27/02; H03M 1/1245; H03M 1/1255
   See application file for complete search history.

HIGH SPEED SAMPLING CIRCUIT

FIELD OF THE INVENTION

This invention relates to the technical field of integrated circuit chips, and more particularly, to a high-speed sampling circuit.

BACKGROUND OF THE INVENTION

The sampling circuit is an important component of the high-speed serial receiving circuit. With the continuous improvement of SERDES (Srializer/Deserializer) signal transmission rate, the speed requirements for its sampling circuit also correspondingly increase. In existing technology, data sampling circuit generally includes a two-stage sampling module and a latch module, the sampling module is used for sampling input data, and the latch module is used for locking and holding the sampled data.

However, using a two-stage sampling module will result in significant sampling delay, which cannot meet the high-speed signal acquisition requirements of SERDES, DDR (Double Data Rate), high-speed storage, ADC (Analog Digital Converter), etc.

SUMMARY OF THE INVENTION

An object of the invention is to provide a high-speed sampling circuit to improve sampling speed.

In Order to Achieve the Above Purpose, the Invention Provides a High-Speed Sampling Circuit, Comprising:
 a sampling module for amplifying a differential input signal;
 a latch module for latching the differential output signal of the sampling module;
 a first control module for controlling the sampling module under a first clock signal;
 a second control module for controlling the latch module under a second clock signal;
 a third control module for controlling the output of the differential output signal under the second clock signal.

Preferably, the high-speed sampling circuit further includes a differential output terminal for outputting the differential output signal; the sampling module, the locking module, and the third control module are all connected to the differential output terminal.

Preferably, the differential output terminal includes a first differential output node and a second differential output node.

Preferably, the sampling module and the first control module are connected to a first control node.

Preferably, the latch module and the second control module are connected to a second control node.

Preferably, the first control module includes an NMOS transistor, and the second control module includes an NMOS transistor.

Preferably, the third control module includes two PMOS transistors.

Preferably, the sampling module includes two NMOS transistors.

Preferably, the latch module includes a first latch branch and a second latch branch, the first latch branch includes a series connection of a PMOS transistor and an NMOS transistor between a power supply and the second control node, the second latch branch includes a series connection of a PMOS transistor and an NMOS transistor between the power supply and the second control node.

The beneficial effects of the invention are: a high-speed sampling circuit is provided, after sampling the differential input signal, the sampling module outputs it to the latch module and controls the latch module to output the differential output signal, compared to the existing two-stage sampling module, it saves the transmission delay of the two-stage sampling module and can improve the performance of the high-speed sampling band of the signal.

DETAILED DESCRIPTION OF THE INVENTION

Figure 1:
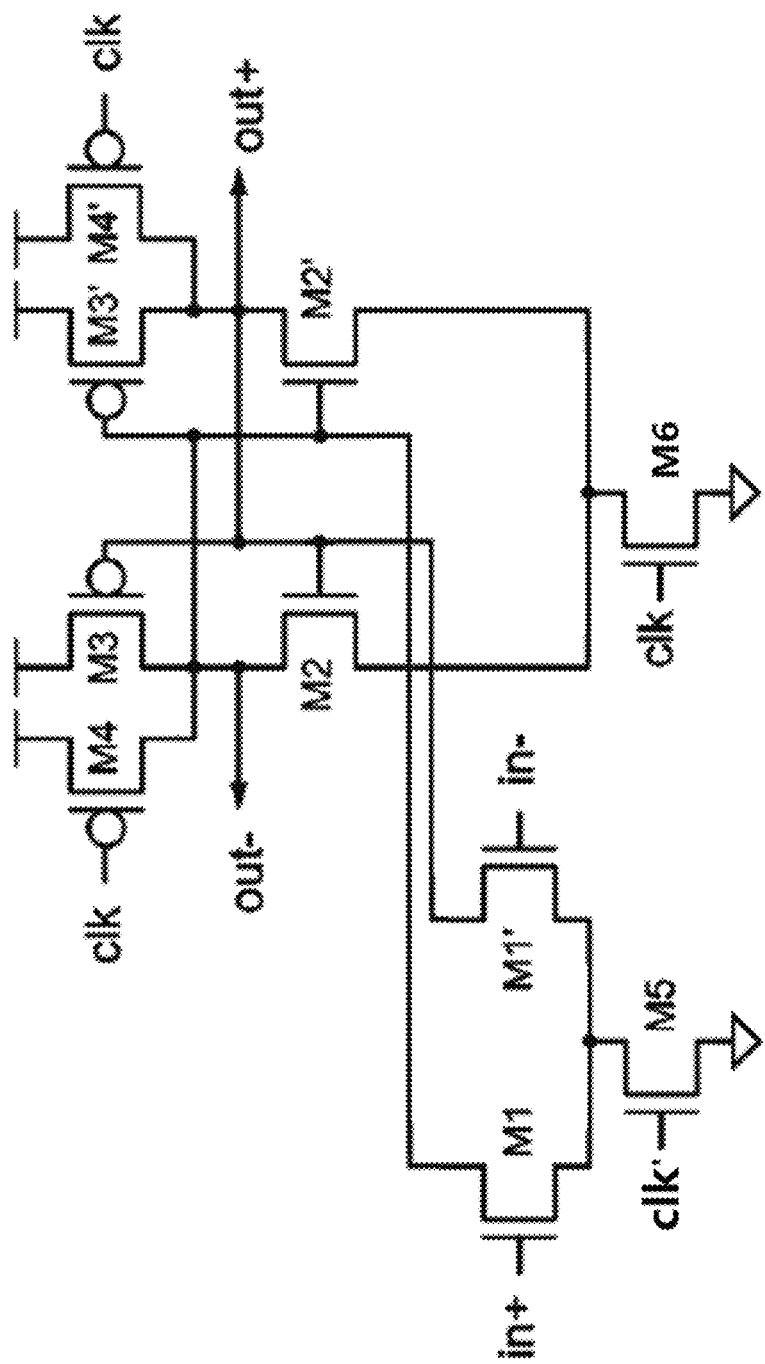
FIG. 1 is a circuit structure diagram of the high-speed sampling circuit according to an embodiment of the invention.

In order to make the purpose, technical project and advantages of this specification clearer, the technical project of this specification will be clearly and completely described in combination with the specific implementation examples of this specification and the corresponding appended drawings. Obviously, the described implementation is only part of this specification, not all of it. Based on the embodiments in this specification, all other embodiments obtained by ordinary technicians in the art without creative work belong to the scope of protection in this specification. It should be noted that the embodiments and features in the embodiments in the present invention can be combined with each other without conflict.

The terms "first", "second" and "third" in the description, claims and the above drawings of the invention are used to distinguish different objects, rather than to describe a specific order. In addition, the term "includes" and any variations thereof are intended to cover non exclusive inclusion. For example, a process, method, system, product or equipment containing a series of steps or units is not limited to the listed steps or units, but optionally also includes the steps or units not listed, or optionally includes other steps or units fixed to these processes, methods, products or equipment.

The embodiment of the invention provides a high-speed sampling circuit, comprising a sampling module, a latch module, a first control module, a second control module, and a third control module.

The sampling module is used to amplify a differential input signal; the latch module is used to latch the differential output signal of the sampling module; the first control module is used to control the sampling module under a first clock signal; the second control module is used to control the latch module under a second clock signal; the third control module is used to control the output of the differential output signal under the second clock signal.

A high-speed sampling circuit provided in an embodiment of the invention, after sampling the differential input signal, the sampling module outputs it to the latch module and controls the latch module to output the differential output signal, compared to the existing two-stage sampling module, it saves the transmission delay of the two-stage sampling module and can improve the performance of the high-speed sampling band of the signal.

In one embodiment, the high-speed sampling circuit further includes a differential output terminal for outputting the differential output signal; the sampling module, the locking module, and the third control module are all connected to the differential output terminal.

Preferably, the differential output terminal includes a first differential output node and a second differential output node. The sampling module is connected to the first differential output node and the second differential output node, the latching module is connected to the first differential output node and the second differential output node, and the third control module is connected to the first differential output node and the second differential output node.

In one embodiment, the high-speed sampling circuit further includes a differential input terminal, a first control node, and a second control node, wherein the differential input terminal includes a first differential input node and a second differential input node.

Preferably, the sampling module and the first control module are connected to a first control node; the latch module and the second control module are connected to a second control node.

In one embodiment, the first control module includes a fifth NMOS transistor, with the drain of the fifth NMOS transistor connected to the first control node, the gate of the fifth NMOS transistor is connected to the first clock signal, and the source of the fifth NMOS transistor is connected to a ground terminal; the second control module includes a sixth NMOS transistor, with the drain of the sixth NMOS transistor connected to the second control node, the gate of the sixth NMOS transistor is connected to the second clock signal, and the source of the sixth NMOS transistor is connected to a ground terminal.

In one embodiment, the third control module includes a forty-one PMOS transistor and a forty-two PMOS transistor, the source of the forty-one PMOS transistor is connected to a power supply, the gate of the forty-one PMOS transistor is connected to a second clock signal, the drain of the forty-one PMOS transistor is connected to a second differential output node; the source of the forty-two PMOS transistor is connected to a power supply, the gate of the forty-two PMOS transistor is connected to the second clock signal, and the drain of the forty-two PMOS transistor is connected to a first differential output node.

In one embodiment, the sampling module includes an eleventh NMOS transistor and a twelfth NMOS transistor, the drain of the eleventh NMOS transistor is connected to a second differential output node, the gate of the eleventh NMOS transistor is connected to a first differential input node, the source of the eleventh NMOS transistor is connected to the source of the twelfth NMOS transistor at a first control node, the gate of the twelfth NMOS transistor is connected to the second differential input node, and the drain of the twelfth NMOS transistor is connected to the first differential output node.

In one embodiment, the latch module includes a first latch branch and a second latch branch.

The first latch branch includes a series connection of a thirty-one PMOS transistor and a twenty-one NMOS transistor between the power supply and the second control node; the source of the thirty-one PMOS transistor is connected to the power supply, the gate of the thirty-one PMOS transistor is connected to the gate of the twenty-one NMOS transistor at a first differential output node, the drain of the thirty-one PMOS transistor is connected to the drain of the twenty-one NMOS transistor at a second differential output node, the source of the twenty-one NMOS transistor is connected to the second control node.

The second latch branch includes a series connection of a thirty-two PMOS transistor and a twenty-two NMOS transistor between the power supply and the second control node; the source of the thirty-two PMOS transistor is connected to the power supply, the gate of the thirty-two PMOS transistor is connected to the gate of the twenty-two NMOS transistor at the second differential output node, the drain of the thirty-two PMOS transistor is connected to the drain of the twenty-two NMOS transistor at the first differential output node, the source of the twenty-two NMOS transistor is connected to the second control node.

In one embodiment, a high-speed sampling circuit is provided, comprising a sampling module for amplifying differential input signals, a latching module for latching the differential output signals of the sampling module, a first control module for controlling the sampling module under a first clock signal clk', a second control module for controlling the latching module under a second clock signal clk, and a third control module for controlling the output of the differential signals under the second clock signal clk.

As shown in FIG. 1, the high-speed sampling circuit further includes a differential output terminal composed of a first differential output node out+ and a second differential output node out−, a differential input terminal composed of a first differential input node in+ and a second differential input node in−, a first control node, and a second control node.

The first control module includes a fifth NMOS transistor M5, with the drain of the fifth NMOS transistor M5 connected to the first control node A, the gate of the fifth NMOS transistor M5 is connected to the first clock signal clk', and the source of the fifth NMOS transistor M5 is connected to the ground terminal GND.

The second control module includes a sixth NMOS transistor M6, with the drain of the sixth NMOS transistor M6 connected to the second control node B, the gate of the sixth NMOS transistor M6 is connected to the second clock signal clk, and the source of the sixth NMOS transistor M6 is connected to the ground terminal GND.

The third control module includes a forty-one PMOS transistor M4 and a forty-two PMOS transistor, the source of the forty-one PMOS transistor is connected to a power supply VDD, the gate of the forty-one PMOS transistor M4 is connected to a second clock signal, the drain of the forty-one PMOS transistor M4 is connected to a second differential output node out−; the source of the forty-two PMOS transistor M4' is connected to the power supply VDD, the gate of the forty-two PMOS transistor M4' is connected to the second clock signal clk, and the drain of the forty-two PMOS transistor M4' is connected to a first differential output node out+.

The sampling module includes an eleventh NMOS transistor M1 and a twelfth NMOS transistor M1', the drain of the eleventh NMOS transistor M1 is connected to a second differential output node out−, the gate of the eleventh NMOS transistor M1 is connected to a first differential input node in+, the source of the eleventh NMOS transistor M1 is connected to the source of the twelfth NMOS transistor M1' at a first control node, the gate of the twelfth NMOS transistor M1' is connected to the second differential input node in−, and the drain of the twelfth NMOS transistor M1' is connected to the first differential output node out+.

The latch module includes a first latch branch and a second latch branch.

The first latch branch includes a series connection of a thirty-one PMOS transistor M3 and a twenty-one NMOS transistor M2 between the power supply VDD and the second control node B; the source of the thirty-one PMOS transistor M3 is connected to the power supply VDD, the gate of the thirty-one PMOS transistor M3 is connected to the gate of the twenty-one NMOS transistor M2 at a first differential output node out+, the drain of the thirty-one PMOS transistor M3 is connected to the drain of the twenty-one NMOS transistor M2 at a second differential output node out−, the source of the twenty-one NMOS transistor M2 is connected to the second control node B.

The second latch branch includes a series connection of a thirty-two PMOS transistor M3' and a twenty-two NMOS transistor M2' between the power supply VDD and the second control node B; the source of the thirty-two PMOS transistor M3' is connected to the power supply VDD, the gate of the thirty-two PMOS transistor M3' is connected to the gate of the twenty-two NMOS transistor M2' at the second differential output node out−, the drain of the thirty-two PMOS transistor M3' is connected to the drain of the twenty-two NMOS transistor M2' at the first differential output node out+, the source of the twenty-two NMOS transistor M2' is connected to the second control node B.

Figure 2:
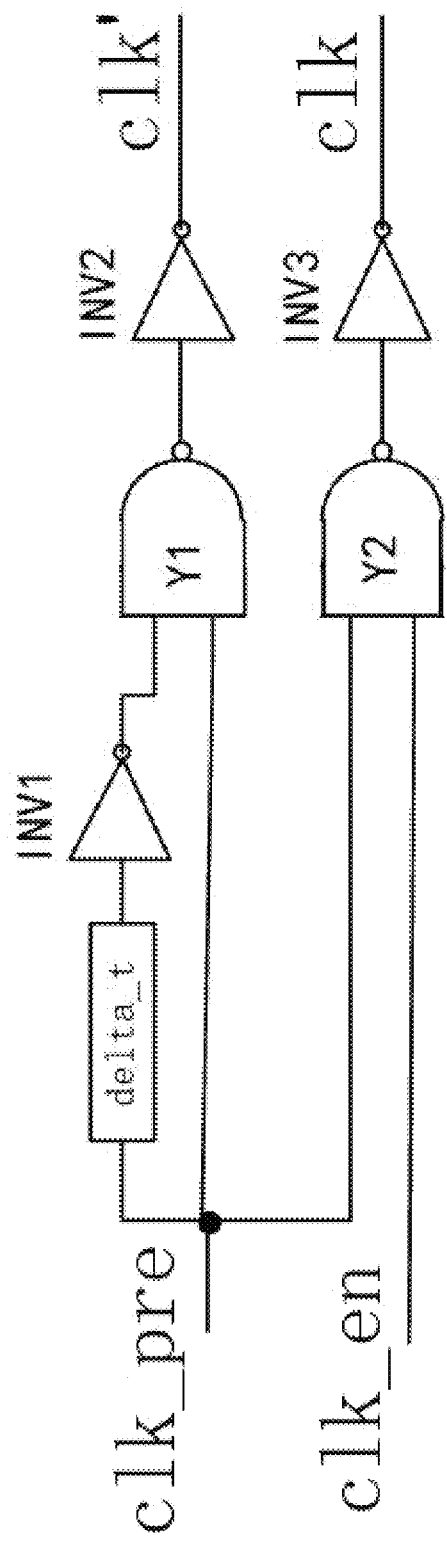
FIG. 2 is a clock signal generation circuit diagram of the high-speed sampling circuit according to an embodiment of the invention.

The first clock signal clk' and the second clock signal clk are generated by the initial clock signal clk_pre, as shown in FIG. 2, that is a circuit diagram for generating the first clock signal clk' and the second clock signal clk. The initial clock signal clk_pre is sequentially transmitted to an input terminal of the first NAND gate Y1 through a delay module Delta_t and a first inverter INV1, the initial clock signal clk_pre is transmitted to another input terminal of the first NAND gate Y1, and then a first clock signal clk' is generated from the output terminal of the first NAND gate Y1 through a second inverter INV2.

The initial clock signal clk_pre and clock enable signal clk_en are respectively transmitted to the two input terminals of the second NAND gate Y2, and then a second clock signal clk is generated from the output terminal of the second NAND gate Y2 through a third inverter INV3.

Figure 3:
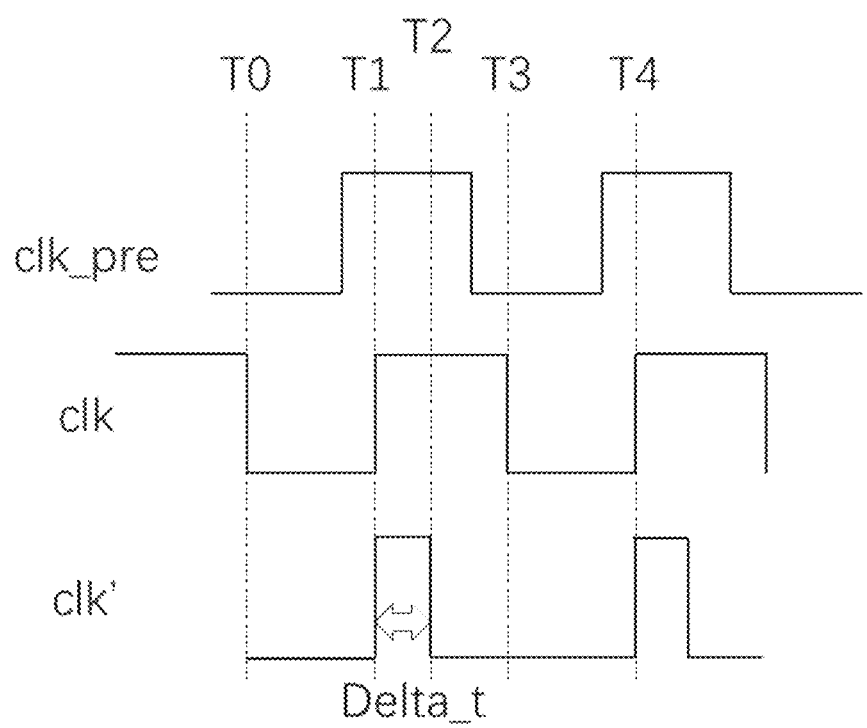
FIG. 3 is a schematic diagram of clock signal generation in the high-speed sampling circuit according to an embodiment of the invention.

As shown in FIG. 3, the rising edge of the initial clock signal clk_pre triggers a first clock signal clk' (instantaneous pulse signal), the fifth NMOS transistor M5 is turned on for a short period of time when the first clock signal clk' remains high, an enable sampling module to sample within the time when the fifth NMOS transistor M5 is turned on. The width of the first clock signal clk' is determined by the delay module Delta_t. The width of the first clock signal clk' can also be achieved in various ways, including but not limited to capacitor charging and discharging delay, buf delay, etc.

The first clock signal clk' turns on the fifth NMOS transistor M5, while the second clock signal clk turns on the sixth NMOS transistor M6 and turns off the forty-first PMOS transistor M4 and the forty-second PMOS transistor M4', enabling the latch module; after a short period of time, the fifth NMOS transistor M5 is turned off, and the latch module amplifies and stores the sampled instantaneous signal.

The sampling module consists of the eleventh NMOS transistor M1 and the twelfth NMOS transistor M1', which sample the differential input at the first differential input node in+ and the second differential input node in−, the sampled differential input is then output to the latch module consisting of the twenty-first NMOS transistor M2, the twenty-second NMOS transistor M2', the thirty-first PMOS transistor M3, and the thirty-second PMOS transistor M3' the latch module outputs to the first differential output node out+ and the second differential output node out−.

Specifically, in stages T0~T1, clk and clk' are both 0, the fifth NMOS transistor M5 and the sixth NMOS transistor M6 are turned off (sampling module and latch module are turned off), the forty-one PMOS transistor M4 and the forty-two PMOS transistor M4' are turned on, and the differential outputs (the first differential output node out+ and the second differential output node out−) are pulled to the power supply VDD.

In stages T1~T2, CLK and CLK' are both 1, the forty-one PMOS transistor M4 and the forty-two PMOS transistor M4' are turned off, the sampling module and the latch module are turned on; due to the T0~T1 stage, both the first differential output node out+ and the second differential output node out− are pulled to equal power supply VDD, after the sampling module is opened, the voltage difference between the first differential input node in+ and the second differential input node in− will cause the latch module to enter an unbalanced state.

In stages T2~T3, CLK' is 0, at which point the sampling module is turned off while the latch module is still in operation; the thirty-one PMOS transistor M3 and the thirty-one PMOS transistor M2, the thirty-two PMOS transistor M3' and the twenty-two NMOS transistor M2' of the two branches of the latch module are connected at this time as a positive feedback, the unbalanced state of the two branches of the latch module is amplified through positive feedback, so that the input state sampled at T1~T2 stages is output through the first differential output node out+ and the second differential output node out−.

In stages T3~T4, CLK and CLK' are both 0, and they return to the reset state in the T0~T1 stages.

Figure 4:
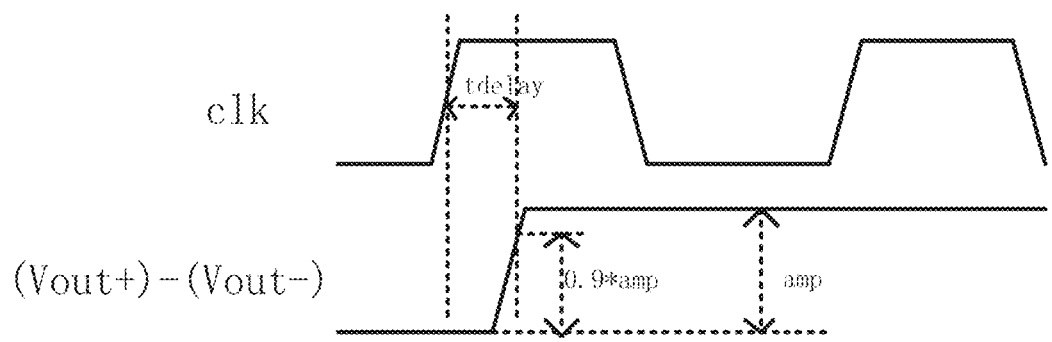
FIG. 4 is a delay comparison diagram of the high-speed sampling circuit according to an embodiment of the invention.

Compared to existing technical solutions, the second level sampling module has been reduced, which can improve performance for high-speed signal sampling. As shown in FIG. 4, it is a delay comparison diagram between the high-speed sampling circuit of the invention and the existing technical solution, the time from half the amplitude of the rising edge of the second clock signal clk to 0.9 times the amp (amplitude) of the output differential signal (outputs Vout+ and Vout− of the first differential output node out+ and the second differential output node out−) is the sampling delay t_delay; with the same transistor size, the sampling delay of the high-speed sampling circuit of the invention is 0.65 times that of the two-stage sampling module circuit used in the existing technology.

The above is only the embodiment of the invention. It should be pointed out here that ordinary technicians in the art can make improvements without departing from the creative idea of the invention, but these belong to the protection scope of the invention.

What is claimed is:

1. A high-speed sampling circuit comprising:
   a sampling module configured for amplifying a differential input signal;
   a latch module configured for latching a differential output signal of the sampling module;
   a first control module configured for controlling the sampling module under a first clock signal;
   a second control module configured for controlling the latch module under a second clock signal; and
   a third control module for controlling the output of the differential output signal under the second clock signal;
   wherein during a first stage from time point T0 to time point T1, both the first clock signal and the second clock signal are each 0, both the sampling module and the latch module are turned off, and both the first differential output node and the second differential output node are operative to be pulled up to a power supply voltage;

wherein during a second stage from time point T1 to time point T2, both the first clock signal and the second clock signal are each 1, both the sampling module and the latch module are turned on, and a voltage difference between the first differential input node and the second differential input node is operative to cause the latch module to enter an unbalanced state;

wherein during a third stage from time point T2 to time point T3, the first clock signal is 0, the sampling module is turned off, and the unbalanced state of two branches of the latch module is amplified through a positive feedback, so that an input state sampled in the T1 to T2 stage is output through the first differential output node and the second differential output node;

wherein during a fourth stage from time point T3 to time point T4, both the first clock signal and the second clock signal are each 0, and the high-speed sampling circuit is operative to return to the reset state in the first stage from the time point T0 to the time point T1.

2. The high-speed sampling circuit according to claim 1, wherein the high-speed sampling circuit further includes a differential output terminal configured for outputting the differential output signal; wherein the sampling module, the latch module, and the third control module are each connected to the differential output terminal.

3. The high-speed sampling circuit according to claim 1, wherein the sampling module and the first control module are connected to a first control node.

4. The high-speed sampling circuit according to claim 3, wherein the latch module and the second control module are connected to a second control node.

5. The high-speed sampling circuit according to claim 4, wherein the first control module includes a fifth NMOS transistor, with a drain of the fifth NMOS transistor connected to the first control node, a gate of the fifth NMOS transistor M5 is connected to the first clock signal, and a source of the fifth NMOS transistor is connected to a ground terminal;

the second control module includes a sixth NMOS transistor, with a drain of the sixth NMOS transistor connected to the second control node, a gate of the sixth NMOS transistor is connected to the second clock signal, and a source of the sixth NMOS transistor is connected to another ground terminal.

6. The high-speed sampling circuit according to claim 4, wherein the third control module includes a forty-one PMOS transistor and a forty-two PMOS transistor, source of the forty-one PMOS transistor is connected to a power supply, a gate of the forty-one PMOS transistor is connected to the second clock signal, a drain of the forty-one PMOS transistor is connected to a second differential output node; a source of the forty-two PMOS transistor is connected to the power supply, a gate of the forty-two PMOS transistor is connected to the second clock signal, and a drain of the forty-two PMOS transistor is connected to a first differential output node.

7. The high-speed sampling circuit according to claim 4, wherein the sampling module includes an eleventh NMOS transistor and a twelfth NMOS transistor, a drain of the eleventh NMOS transistor is connected to a second differential output node, a gate of the eleventh NMOS transistor is connected to a first differential input node, a source of the eleventh NMOS transistor is connected to a source of the twelfth NMOS transistor at the first control node, a gate of the twelfth NMOS transistor is connected to a second differential input node, and a drain of the twelfth NMOS transistor is connected to the first differential output node.

8. The high-speed sampling circuit according to claim 4, wherein the latch module includes a first latch branch and a second latch branch, wherein the first latch branch includes a thirty-one PMOS transistor and a twenty-one NMOS transistor that are connected in series between the power supply and the second control node; a source of the thirty-one PMOS transistor is connected to the power supply, a gate of the thirty-one PMOS transistor is connected to a gate of the twenty-one NMOS transistor at a first differential output node, a drain of the thirty-one PMOS transistor is connected to a drain of the twenty-one NMOS transistor at a second differential output node, a source of the twenty-one NMOS transistor is connected to the second control node;

wherein the second latch branch includes a thirty-two PMOS transistor and a twenty-two NMOS transistor that are connected in series between the power supply and the second control node; a source of the thirty-two PMOS transistor is connected to the power supply, a gate of the thirty-two PMOS transistor is connected to a gate of the twenty-two NMOS transistor at the second differential output node, a drain of the thirty-two PMOS transistor is connected to a drain of the twenty-two NMOS transistor at the first differential output node, a source of the twenty-two NMOS transistor is connected to the second control node.

* * * * *